United States Patent [19]
Ferrante

[11] Patent Number: 5,919,378
[45] Date of Patent: Jul. 6, 1999

[54] PROCESS FOR AUTOMATICALLY MAKING PRINTING SLEEVES

[75] Inventor: Mario Ferrante, Laxou, France

[73] Assignees: Photomeca/Egg, Pompey, France; Du Pont De Nemours (Germany) GmbH, Bad Hamburg v.d.H., Germany

[21] Appl. No.: 08/884,727

[22] Filed: Jun. 30, 1997

[30]      Foreign Application Priority Data

Jul. 19, 1996 [FR] France ................................. 96 09349

[51] Int. Cl.⁶ ........................................... B44C 1/22
[52] U.S. Cl. .............................. 216/10; 216/52; 156/345
[58] Field of Search ................................. 216/8, 10, 52; 156/345 L, 345 LC

[56]             References Cited

U.S. PATENT DOCUMENTS 4,104,104  8/1978  Anderson ................................ 156/345
5,407,527  4/1995  Ferrante et al. ...................... 156/345 X

*Primary Examiner*—William Powell
*Attorney, Agent, or Firm*—Gary M. Cohen

[57]              ABSTRACT

A process for manufacturing photopolymer blocks, which are first exposed to UVA radiation and mounted on printing cylinders to in combination form a printing sleeve for carrying out printing in flexography and in dry offset, includes a series of automated steps for manufacturing the printing sleeves. A device for implementing the process includes a series of stations, arranged in line, one after the other, including a storage magazine for receiving the exposed printing sleeves, a solvent-vapor lock, an etching device, a drying device and a storage station for receiving the completed printing sleeves.

16 Claims, 1 Drawing Sheet

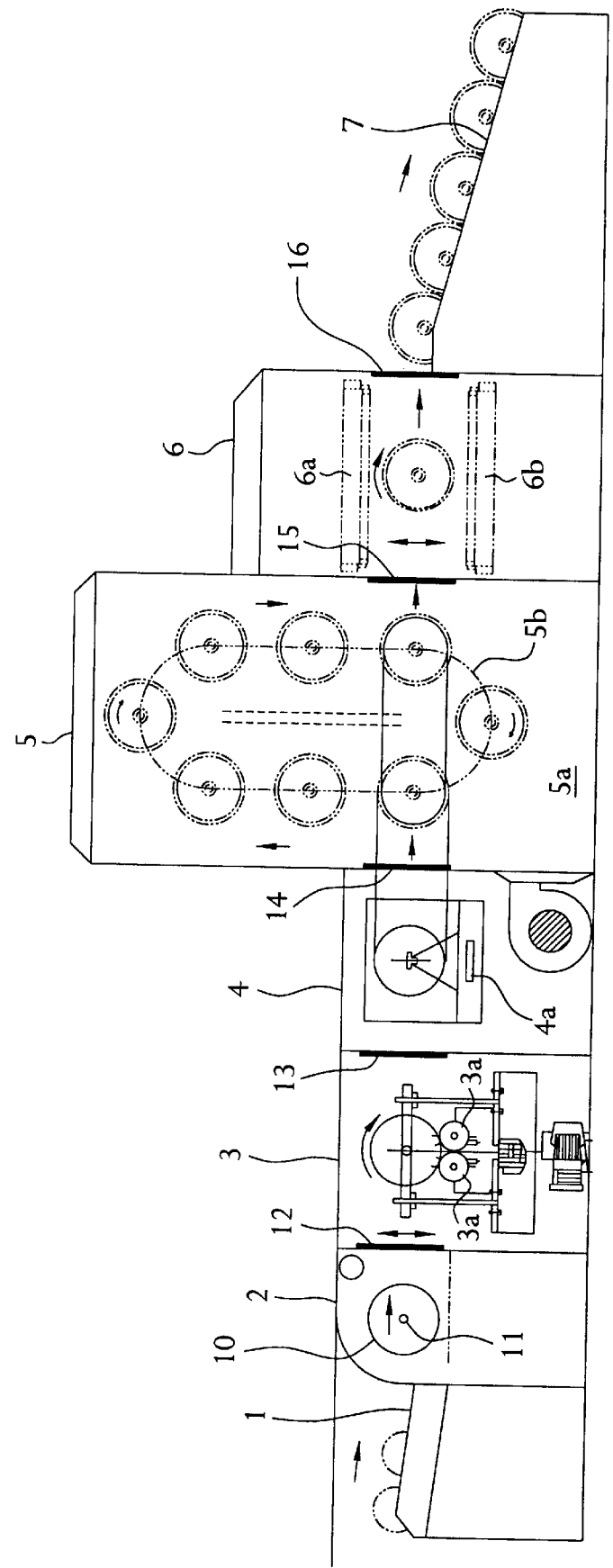

PROCESS FOR AUTOMATICALLY MAKING PRINTING SLEEVES

BACKGROUND OF THE INVENTION

The present invention relates to a process for preparing printing sleeves supporting photopolymer plates for use as printing forms in printing techniques such as, for example, flexography or dry offset. The invention also relates to a device for implementing the process.

It is already known that it is possible to obtain a block for flexography by exposing a photopolymer plate sensitive to ultraviolet radiation, with the interposition of a negative film which leaves exposed to the radiation those zones which are to come into relief on the finished block.

Over the last few years, printing techniques have developed more and more towards increased use of printing sleeves or cylinders.

This is largely due to the latest technologies, which now make it possible to impress plates or photopolymer blocks directly by laser, with the laser moving along a horizontal axis parallel to the axis of rotation of the printing sleeve and with the printing sleeve rotating about its axis.

In the remainder of this description, the term printing sleeve will be used to define a photopolymer plate or block mounted on a printing cylinder.

There are currently machines and processes on the market which allow manual development of printing sleeves mounted on an expansible cylinder.

Each printing phase requires the use of a different printing sleeve which then entails time-consuming and tedious operations for preparing these sleeves. Moreover, such operations are most often carried out manually.

Devices which use printing sleeves are therefore expensive to employ in terms of manufacturing, and are also not entirely satisfactory in terms of results, because of the difficulties mentioned above, namely their manual and tedious nature.

It is therefore the primary object of the present invention to fully automate the entire process of preparing printing sleeves.

Another object of the present invention is to prepare printing sleeves in any format in a fully automatic machine which is hermetically sealed against any solvent vapor.

Many problems needed to be solved in order to achieve these objects. In particular, it was necessary to obtain an in-line machine taking up a minimal floor space, to provide an assembly which is fully sealed hermetically against solvent vapors, and to mount the sleeves on a transport spindle in the various development phases, for printing sleeves of arbitrary diameter and length.

SUMMARY OF THE INVENTION

In accordance with the present invention, these results are achieved by a process for manufacturing photopolymer blocks, which are first exposed to UVA radiation and mounted on printing cylinders. This combination of the photopolymer blocks plus the printing cylinders will hereafter be referred to as a "printing sleeve", for carrying out printing in flexography and in dry offset. All of the steps in the process for manufacturing the printing sleeves are automated, and the process includes at least one of the following steps, namely, in order:

a step of extracting the solvent vapors by suction, a step of etching by brushing and soaking in a solvent or a mixture of water plus an additive, a step of drying by passing through a dynamic stove using pulsed hot air, and a step of storing finished sleeves.

According to a preferred variant of the process, following the drying step, the process may further include a step of finishing the printing sleeve by exposing the photopolymer blocks to UVA and UVC radiations.

The invention also relates to all devices for implementing the process, and in particular, to a preferred but non-limiting embodiment which includes a device for implementing the process which is comprised of the following stations, arranged one after the other in line:

a storage magazine which receives the printing sleeves (which are exposed beforehand to UVA radiation), a solvent-vapor lock for removing the solvent, an etching device, a drying device, and a storage station for completed printing sleeves.

BRIEF DESCRIPTION OF THE DRAWING

The present invention will be understood more clearly with reference to of the following description, together with the appended single figure which is a schematic diagram of a non-limiting example of implementation of the process.

DETAILED DESCRIPTION OF A PREFERRED EMBODIMENT

The photopolymer blocks are fixed beforehand to the sleeves (10) using a double-sided adhesive film, and are exposed by laser radiation or, in a traditional method, by negative film on a rotary exposure machine, to UVA radiation.

A storage magazine (1) receives the exposed sleeves (10).

The sleeves are fixed on spindles (11), allowing them to be held for rotation and to be transferred during the various stages of manufacture of the printing sleeves (10).

The spindles make it possible to transport printing sleeves (10) of any diameter, with typical sleeves ranging from an external diameter of 50 mm to 360 mm and having arbitrary length.

The spindles also allow the automatic transfer and introduction, one after the other, of sleeves inside a solvent-vapors lock (2).

The printing sleeves are then transferred using their spindles to an etching device (3), which essentially includes suction means for extracting the solvent vapors, brushes (3*a*) for etching, means for discharging the solvent loaded with photopolymer, an etching tank, solvent introducing means, and an inlet for receiving clean solvent in the etching tank.

The operating procedure in the etching device is as follows:

The printing sleeves descend towards the etching brushes (3*a*). The etching solvent is then introduced and the etching brushes (3*a*) start to rotate. The automatic etching is programmed beforehand depending on the type of photopolymer plate or block to be treated.

The printing sleeves move away from the brushes (3*a*) in order to allow clean solvent to enter the etching tank, and to allow the brushes to be cleaned by a bubbling action.

The sleeves re-descend to touch the brushes, in order to clean the photopolymer plates or blocks with the clean solvent.

The printing sleeves are then dried by raising the brushes (3*a*).

The printing sleeves then return to their initial position in the etching device.

The suction means are turned on in order to extract the solvent vapor, and the etching tank is emptied.

The printing sleeve is then transferred to the following station.

The device of the present invention preferably includes, downstream of the etching device (3), a printing-sleeve inspection chamber (4) having a drawer (4a) for extracting the printing sleeves and having suction means.

It is thus possible to extract (to the side) the printing sleeve mounted on the drawer (4a) and to inspect the quality of the etching, for example visually, in a very practical fashion.

The printing sleeve is returned to the device for the process to continue simply by closing the drawer (4a).

The sleeve is then transferred to the drying device 5. The drying device 5 is principally a drying stove (5a) equipped with a carousel (5b) for receiving sleeves, and having a device for blowing hot air through the drying stove. The drying device 5 also preferably includes an automated machine for determining the drying time in relation to the type of printing sleeve.

This "dynamic" stove makes it possible for the flexography or offset photopolymer blocks fixed on the sleeves to be dried at a temperature of 60°+/−2°.

The polymer is dried very rapidly by the combined effects of the rotation of the carousel and the device for blowing hot air at a very high speed (2 to 8 meters per second).

After passing through the drying device, the sleeve is ejected either to a storage station (7) or to a finishing station.

The finishing station (6) includes UVA and UVC tubes (6a,6b) placed above and below the printing sleeve. The UVA and UVC tubes are movable vertically, and can be automatically set at a distance relative to the external diameter of the sleeve.

The sleeve is at the same time rotatable about its axis in order to allow uniform finishing exposure.

It should be noted that the finishing station may be passed through separately, and not as part of the automated line, given that the plate is dry and is not emitting solvent vapors.

Automatic means can be provided to manage all the exposure times in the sleeve finishing process (i.e. programmed illumination of the UVA and UVC tubes (6a,6b)).

An automatic machine makes it possible to manage all the exposure times to obtain perfect finishing of the sleeves.

In addition, each station in the device as described above is separated from the following one by various shutters 12, 13, 14, 15, 16, making it possible to hermetically seal the several stations from one another and to have better extraction of the solvent vapors.

Schematically, the automatic process according to the present invention can be summarized as a series of steps, initially including:

loading the sleeves onto an expansible spindle, with the sleeves supporting the photopolymer plate (which has been exposed beforehand to UVA rays), inserting a sleeve into the solvent-vapor insulation chamber, and automatically passing the sleeve into the rotary-brush etching section.

The brushes are automatically adjusted according to the diameter of the sleeves and the type of photopolymers. The etching, rinsing and drying steps will take place automatically.

The intermediate station makes it possible to inspect the sleeve after etching, on demand, or to extract a sleeve, on demand.

Subsequent steps associated with the process include:

entry into the dynamic stove using pulsed hot air. The high speed of the hot air permits very short drying times for the photopolymer), entry into the finishing station, characterized by the exposure of the photopolymer to UVC and UVA rays over the diameter of the sleeve. The tubes will always be at the same distance from the surface of the sleeve, in order to better program the exposure times), and automatic removal of the finished sleeves, which are already mounted on the cylinders of the rotary press.

A programmable automatic machine makes it possible to program all the steps in the manufacture of the printing sleeves automatically, without operator intervention.

The device thus allows the operator to load the machine with the sleeves, start the process, and then leave. On the next morning, the operator will find all (e.g., eight) sleeves completed and ready to be mounted on the cylinders of the rotary printing presses for use in flexography or in dry offset.

By way of example, the process and device according to the present invention makes it possible to prepare a printing sleeve in about half an hour, when a traditional system would take six hours.

I claim:

1. A process for manufacturing photopolymer blocks which are exposed to UVA radiation and thereafter mounted on printing cylinders, wherein the photopolymer blocks and the printing cylinders combine to form printing sleeves for printing in flexography and in dry offset, and wherein the process is comprised of automated steps including:

etching the printing sleeves in an etching tank, by brushing the printing sleeves and soaking the printing sleeves in a solvent;

extracting solvent vapors from the etching tank, by suction;

passing the printing sleeves through a dynamic stove in communication with the etching tank, and drying the printing sleeves using pulsed hot air; and storing finished printing sleeves.

2. The process of claim 1 which further includes the step of finishing the printing sleeves by exposure to UVA and UVC radiations.

3. The process of claim 1 which further includes the steps of mounting the photopolymer blocks onto the printing cylinders, and supporting the resulting printing sleeves by spindles associated with the printing cylinders.

4. A process for manufacturing photopolymer blocks which are exposed to UVA radiation and thereafter mounted on printing cylinders, wherein the photopolymer blocks and the printing cylinders combine to form printing sleeves for printing in flexography and in dry offset, and wherein the process is comprised of automated steps including:

etching the printing sleeves in an etching tank, by brushing the printing sleeves and soaking the printing sleeves in a mixture of water plus an additive;

extracting vapors associated with the mixture from the etching tank, by suction;

passing the printing sleeves through a dynamic stove in communication with the etching tank, and drying the printing sleeves using pulsed hot air; and storing finished printing sleeves.

5. The process of claim 4 which further includes the step of finishing the printing sleeves by exposure to UVA and UVC radiations.

6. The process of claim 4 which further includes the steps of mounting the photopolymer blocks onto the printing cylinders, and supporting the resulting printing sleeves by spindles associated with the printing cylinders.

7. An apparatus for manufacturing photopolymer blocks which are exposed to UVA radiation and thereafter mounted on printing cylinders, wherein the photopolymer blocks and the printing cylinders combine to form printing sleeves for printing in flexography and in dry offset, and wherein the apparatus includes a series of stations, arranged one after another, comprising:

a storage magazine for receiving the printing sleeves;

a solvent-vapor lock in communication with the storage magazine, for receiving the printing sleeves from the storage magazine;

an etching station in communication with the solvent-vapor lock, for receiving the printing sleeves from the solvent-vapor lock;

a drying station in communication with the etching station, for receiving the printing sleeves from the etching station; and a storage station in communication with the drying station, for receiving completed printing sleeves from the drying station.

8. The apparatus of claim 7 which further includes a printing sleeve inspection chamber downstream of the etching station, wherein the inspection chamber has a drawer for extracting the printing sleeves for inspection.

9. The apparatus of claim 8 wherein the inspection chamber further includes suction means in communication therewith.

10. The apparatus of claim 7 wherein the etching station includes suction means for extracting solvent vapors, brushes for etching the printing sleeves, means for discharging solvent loaded with photopolymer, an etching tank, clean solvent discharge means, and an inlet for introducing the clean solvent into the etching tank.

11. The apparatus of claim 7 which further includes a finishing station in communication with the drying station, wherein the finishing station includes UVA and UVC tubes, and wherein the UVA and UVC tubes are movable at equal distances from the printing sleeves.

12. The apparatus of claim 7 wherein the drying station includes a drying stove having a carousel for receiving the printing sleeves to be dried, means for blowing hot air through the drying stove and over the printing sleeves, and automated means for determining drying times responsive to the type of printing sleeves being dried.

13. The apparatus of claim 7 wherein the printing sleeves include spindles for mounting the printing sleeves for rotation as the printing sleeves are transported through the apparatus during manufacture of the printing sleeves.

14. The apparatus of claim 13 wherein the spindles are associated with the apparatus so that printing sleeves of varying diameter can be transported through the apparatus.

15. The apparatus of claim 14 wherein the printing sleeves have an external diameter ranging from 50 mm to 360 mm, and an arbitrary length.

16. The apparatus of claim 7 wherein the stations of the apparatus are separated from one another by a plurality of shutters, for hermetically sealing the stations from one another and for improved extraction of the solvent vapors.

\* \* \* \* \*